(12) United States Patent
Brandonisio (10) Patent No.: US 10,840,804 B2
(45) Date of Patent: Nov. 17, 2020

(54) TIME-BASED SUPPLY VOLTAGE DIFFERENCE TO DIGITAL CONVERSION

(71) Applicant: Infineon Technologies AG, Neubiberg (DE)

(72) Inventor: Franesco Brandonisio, Villach (AT)

(73) Assignee: Infineon Technologies AG, Neubiberg (DE)

( * ) Notice: Subject to any disclaimer, the term of this patent is extended or adjusted under 35 U.S.C. 154(b) by 64 days.

(21) Appl. No.: 16/004,738

(22) Filed: Jun. 11, 2018

(65) Prior Publication Data

US 2019/0379284 A1    Dec. 12, 2019

(51) Int. Cl.
| | |
|---|---|
| *H02M 3/155* | (2006.01) |
| *G04F 10/00* | (2006.01) |
| *H03K 3/03* | (2006.01) |
| *H02M 3/157* | (2006.01) |
| *H02M 1/00* | (2006.01) |
| *G05F 1/56* | (2006.01) |

(52) U.S. Cl.
CPC .......... *H02M 3/155* (2013.01); *G04F 10/005* (2013.01); *H03K 3/0315* (2013.01); *G05F 1/562* (2013.01); *H02M 3/157* (2013.01); *H02M 2001/0012* (2013.01)

(58) Field of Classification Search
CPC ................. H02M 3/155; H02M 3/157; H02M 2001/0012; G05F 1/562; G04F 10/005
See application file for complete search history.

(56) References Cited

U.S. PATENT DOCUMENTS

| | | | |
|---|---|---|---|
| 9,024,606 B2 * | 5/2015 | Adell .................. | H02M 3/1588 323/283 |
| 2013/0163126 A1 * | 6/2013 | Dong .................. | G06F 13/4086 361/56 |
| 2018/0188762 A1 * | 7/2018 | Wang ........................ | G06F 1/26 |

* cited by examiner

*Primary Examiner* — Kyle J Moody
*Assistant Examiner* — Lakaisha Jackson
(74) *Attorney, Agent, or Firm* — Eschweiler & Potashnik, LLC (57) ABSTRACT

Systems, methods, and circuitries are provided to generate a regulated supply voltage based on a target voltage. In one example, a method includes converting the target voltage to a first digital time-based signal and converting the regulated supply voltage to a second digital time-based signal. A difference signal is generated based at least on a difference between the first digital time-based signal and the second digital time-based signal. Regulator circuitry is controlled to generate the regulated supply voltage based at least on the difference signal.

19 Claims, 10 Drawing Sheets

TIME-BASED SUPPLY VOLTAGE DIFFERENCE TO DIGITAL CONVERSION

FIELD

The present disclosure relates to the field of voltage regulation and conditioning and in particular to methods, systems, and circuitry for regulation of supply voltages for electronic components in electronic devices.

BACKGROUND

Voltage regulators have many applications in electronic devices. In general, voltage regulators are used to generate a smooth, consistent voltage to sensitive electronic components such as digital circuits, microprocessors, and phase locked loops (PLLs) to ensure good performance and prevent damage to the components. The voltage regulator inputs an external supply voltage (e.g., 2.5 V in some systems) which is greater than a target regulated supply voltage (e.g., 0.9 V in some systems) and, from the external supply voltage, generates the regulated supply voltage.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Voltage regulators are typically analog intensive blocks with low portability because large capacitors are used to enhance noise performance and power-supply-rejection. To address some of the shortcomings of analog intensive voltage regulators, a design trend is to implement much of the voltage regulator in digital circuitry. Digital voltage regulators provide many benefits including being compact, reconfigurable, and capable of built-in self-testing. Digital voltage regulators include complex analog-to-digital converters (ADCs) to build the feedback loop. The output of the ADC is the difference between the regulated supply voltage and a reference voltage which is selected to be nominally equivalent to the target regulated supply voltage. The output of the ADC, properly filtered and converted to an analog signal, is used to drive a pass-device in the voltage regulator that regulates the external supply voltage.

While it may seem desirable to simply use an unregulated target voltage (e.g., an unregulated core voltage of 0.9V from a core voltage supply used to supply other components) as the reference voltage for the ADC, to function properly, the ADC requires a very clean reference voltage. An unregulated target voltage is not usually smooth and reliable enough for the ADC. Thus digital voltage regulators generate a clean reference voltage for the ADC, often using a bandgap generator and analog low-pass filters, which results in considerable expense and the consumption of significant space.

Described herein are methods, systems, and circuitries that use a voltage-to-time conversion to determine the difference between the regulated supply voltage and the target voltage for use in regulating the supply voltage. In this manner, a separate clean reference voltage need not be generated and instead an unregulated target voltage can be used in a feedback loop of the regulator to generate a difference signal that drives the voltage regulator. This eliminates the need for costly and space consuming components such as band-gap voltage generators and analog low pass filters.

Figure 1:
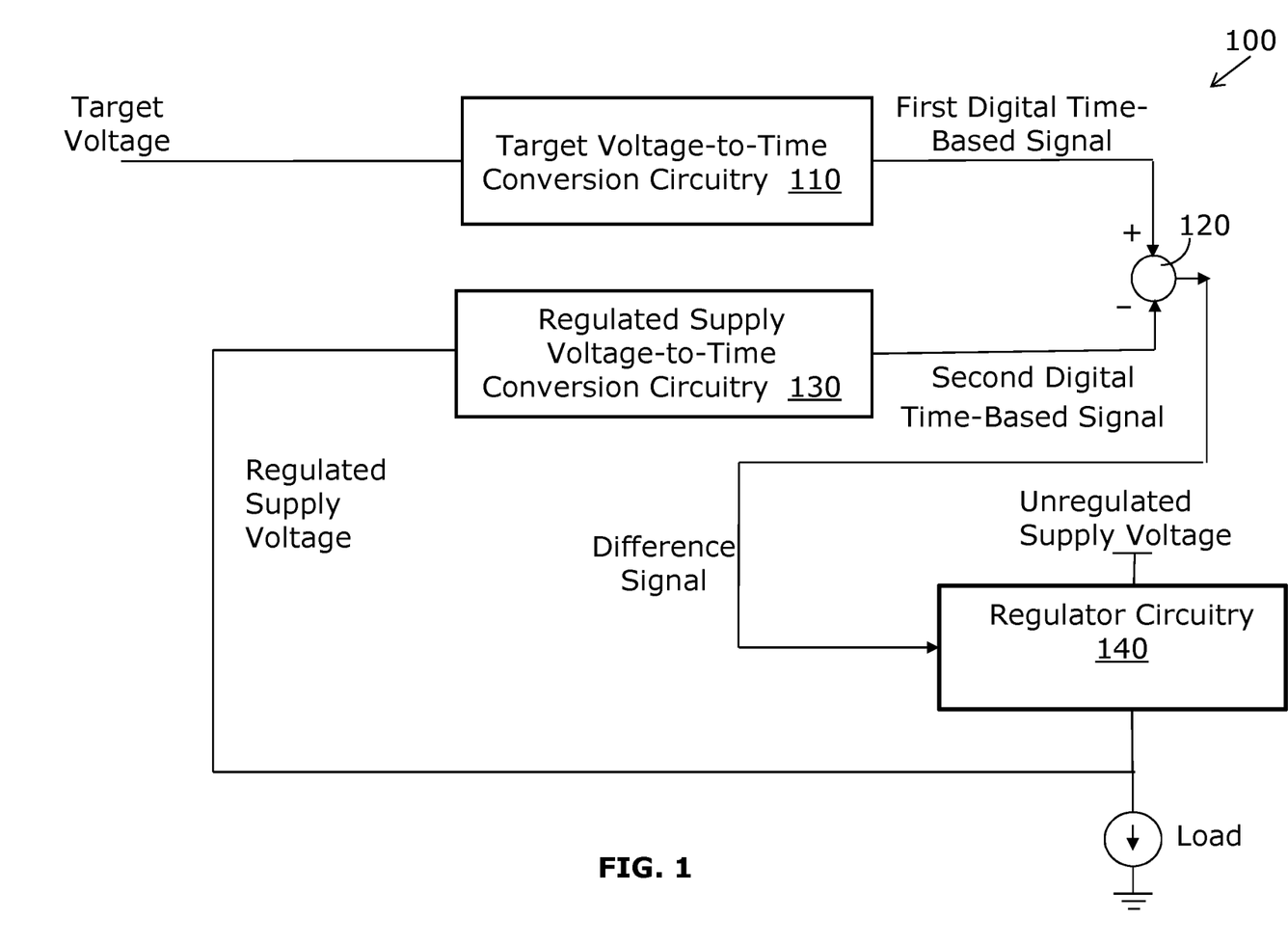
FIG. 1 illustrates one example of a supply voltage regulation system that includes voltage to time conversion circuitry in accordance with various aspects described.

FIG. 1 illustrates a supply voltage regulation system 100 that regulates an unregulated supply voltage to generate a regulated supply voltage that is provided to a load. The supply voltage regulation system 100 includes regulator circuitry 140 that regulates the unregulated supply voltage based on a difference signal that corresponds to the difference between the regulated supply voltage and a target voltage. To generate the difference signal, a feedback loop includes a target voltage-to-time conversion circuitry 110, a regulated supply voltage-to-time conversion circuitry 130, and difference circuitry 120. The voltage-to-time conversion circuitries each generate a time based signal that has a time-based characteristic that is based on a magnitude of the input voltage. For example, the target voltage-to-time conversion circuitry 110 may generate a first digital time-based signal that has a period that is proportional to a magnitude of the target voltage while the regulated supply voltage-to-time conversion circuitry 130 may generate a second digital time-based signal that has a period that is proportional to a magnitude of the regulated supply voltage fed back from the regulator.

The difference circuitry 120 determines a difference between the time-based characteristic of the first digital time-based signal and the second digital time-based signal (e.g., a difference in period duration). The difference circuitry 120 may be an addition circuit that achieves subtraction by a proper time-based operation. For example, a signal with a period equal to the difference between the periods of two other signals A and B can be produced by multiplying the two signals A and B and then low pass filtering. In another example, the duration of the periods of two signals is associated directly with the amplitude of two digital words (e.g., by means of counters) and the subtraction is implemented via a pure digital operation. The difference circuitry 120 may include a suitable resistor network, which may consist of ordinary resistors but also complex resistors or impedances, i.e. combinations of inductors capacitors and resistors, that combines the two signals. The difference circuity 120 may also include transistors or operational amplifiers (OPAMPs) where the first and second digital time-based signals are fed into different ports of an OPAMP.

Figure 2:
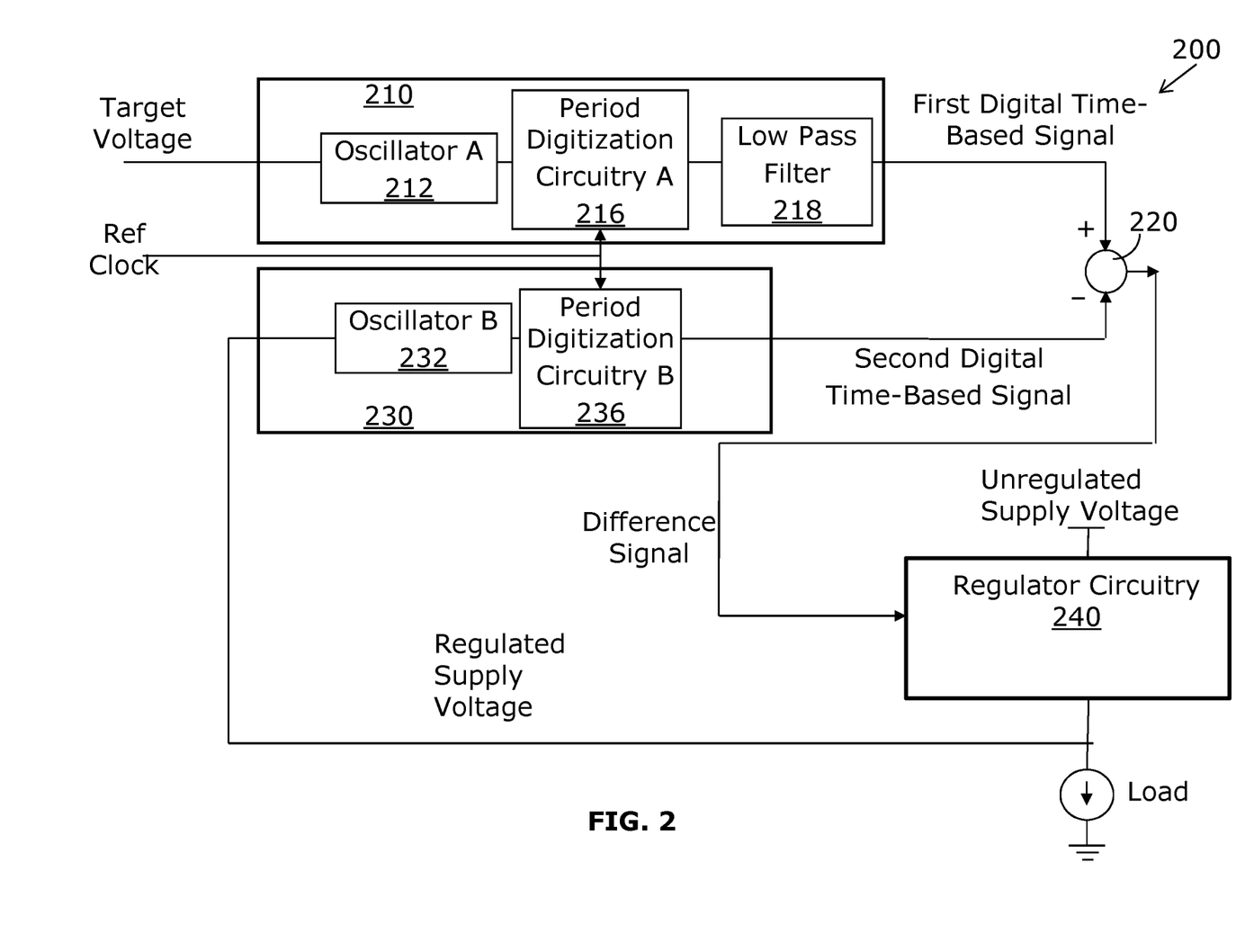
FIG. 2 illustrates one example of the supply voltage regulation system of FIG. 1 in which the voltage to time conversion circuitry includes an oscillator and period digitization circuitry in accordance with various aspects described.

FIG. 2 illustrates an example voltage regulation system 200 in which voltage-to-time conversion circuitries 210, 230 include oscillators A and B, respectively. Oscillator A and oscillator B share the same design parameters and are selected to function as similarly as possible. The target voltage-to-time conversion circuitry 210 includes oscillator A 212, period digitization circuitry A 216, and a low pass filter 218. The oscillator A is supplied by an unregulated target voltage and in response generates a signal having a period that is related to the magnitude of the unregulated target voltage. The period digitization circuitry A 216 digitizes the oscillator A signal to generate a digital time-based signal. In one example, the period digitization circuitry A 216 includes a counter (not shown) that counts oscillator signal cycles that occur during one period of the reference clock. The low pass filter 218 removes noise components from the unregulated target voltage in the signal output by the period digitization circuitry A 216 to generate the first digital time-based signal. Ideally, the output of the low pass filter 218 is a constant, digital word. Note that the bandwidth of the voltage regulation system 200 is not limited by the digital filter.

The oscillator B 232 is supplied by the regulated supply voltage fed back from the load. The oscillator B 232 generates a signal having a period that is related to the magnitude of the regulated supply voltage. The period digitization circuitry B 236 digitizes the oscillator B signal to generate the second digital time-based signal. In one example, the period digitization circuitry B 236 includes a counter (not shown) that counts oscillator signal cycles that occur during one period of the reference clock. Because the regulated supply voltage should be free from noise, there may be no need for a low pass filter in the second voltage-to-time conversion circuitry 230. Difference circuitry 220 determines the difference between the first digital time-based signal and the second digital time-based signal to generate the difference signal, which is provided to regulator circuitry 240 for regulating the unregulated supply voltage.

Figure 2A:
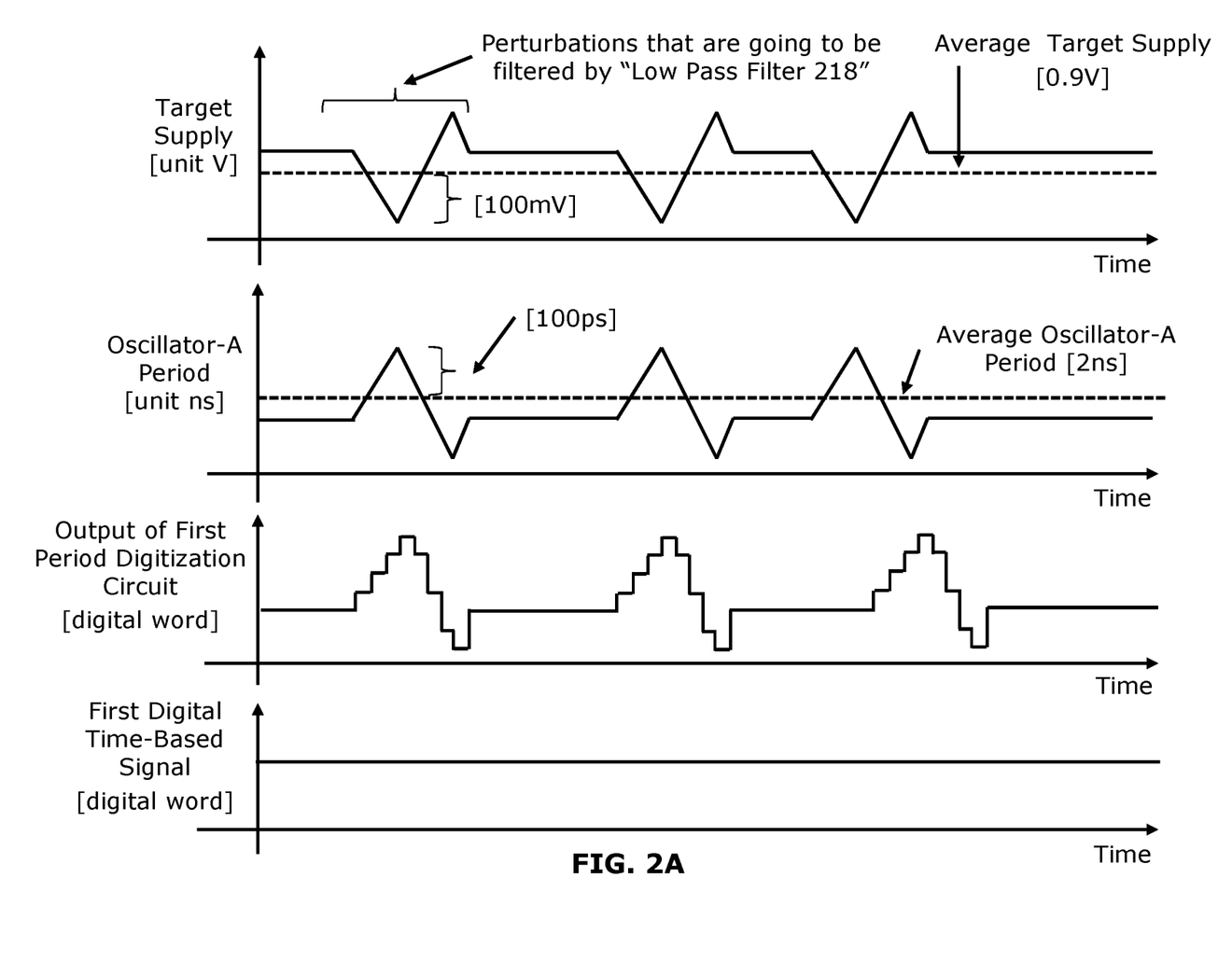
FIGS. 2A-2B illustrate various examples of time-base signals that are present in the supply voltage regulation system of FIG. 2 under various operating circumstances.

FIG. 2A illustrates an example of the first digital time-based signal of FIG. 2 in the presence of fast perturbations in the target voltage that are suppressed by the low pass filter 218. The phrase "fast perturbations" means perturbations with spectral components outside the bandwidth of the low pass filter 218. Note that the period of the Oscillator-A output signal increases when the target voltage decreases. FIG. 2A shows a linear relationship between the Oscillator-A output signal period and target voltage which is true when the variations in the target supply are not too large. The low pass filter 218 completely suppresses the variations in the output of the period digitization circuitry A 216 in FIG. 2. In general, the perturbation in the period digitization circuitry A 216 might only get attenuated by the low pass filter 218.

Figure 2B:
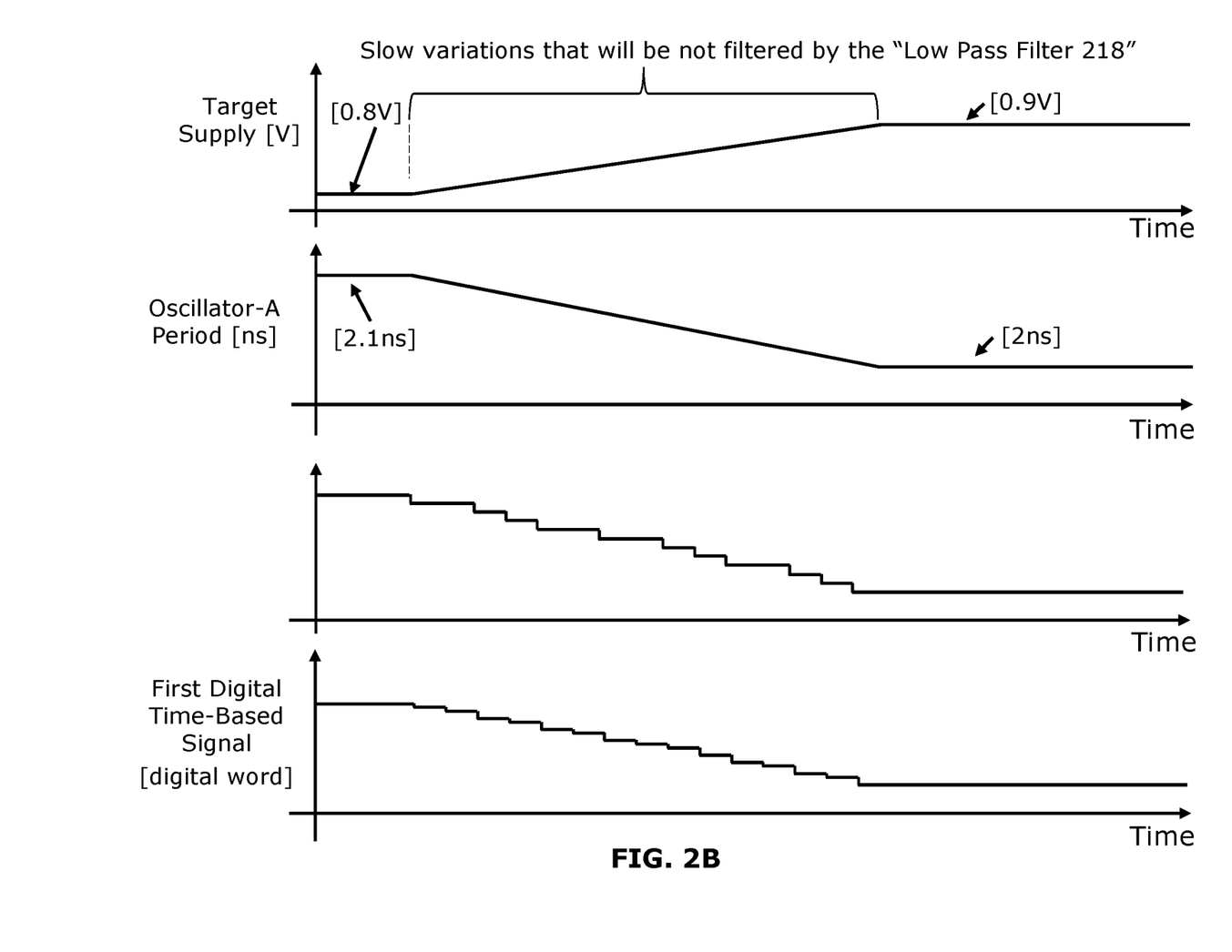

FIG. 2B illustrates an example the first digital time-based signal in the presence of slow variations in the target voltage of FIG. 2. The phrase "slow variations" means variations with spectral components inside the bandwidth of the low pass filter 218. The bandwidth of the low pass filter 218 is not necessarily equal to that of the digital voltage regulator in FIG. 2. Generally, the low pass filter 218 enables the voltage regulator to bring the regulated supply as close as possible to the average value of the target supply. The fact that the low pass filter 218 tracks very slow variations in the target voltage is desired by design. In fact, a general voltage regulator with a general reference voltage tracks variations in the reference voltage that are slow enough (namely with spectral components inside the voltage regulator bandwidth).

Figure 3:
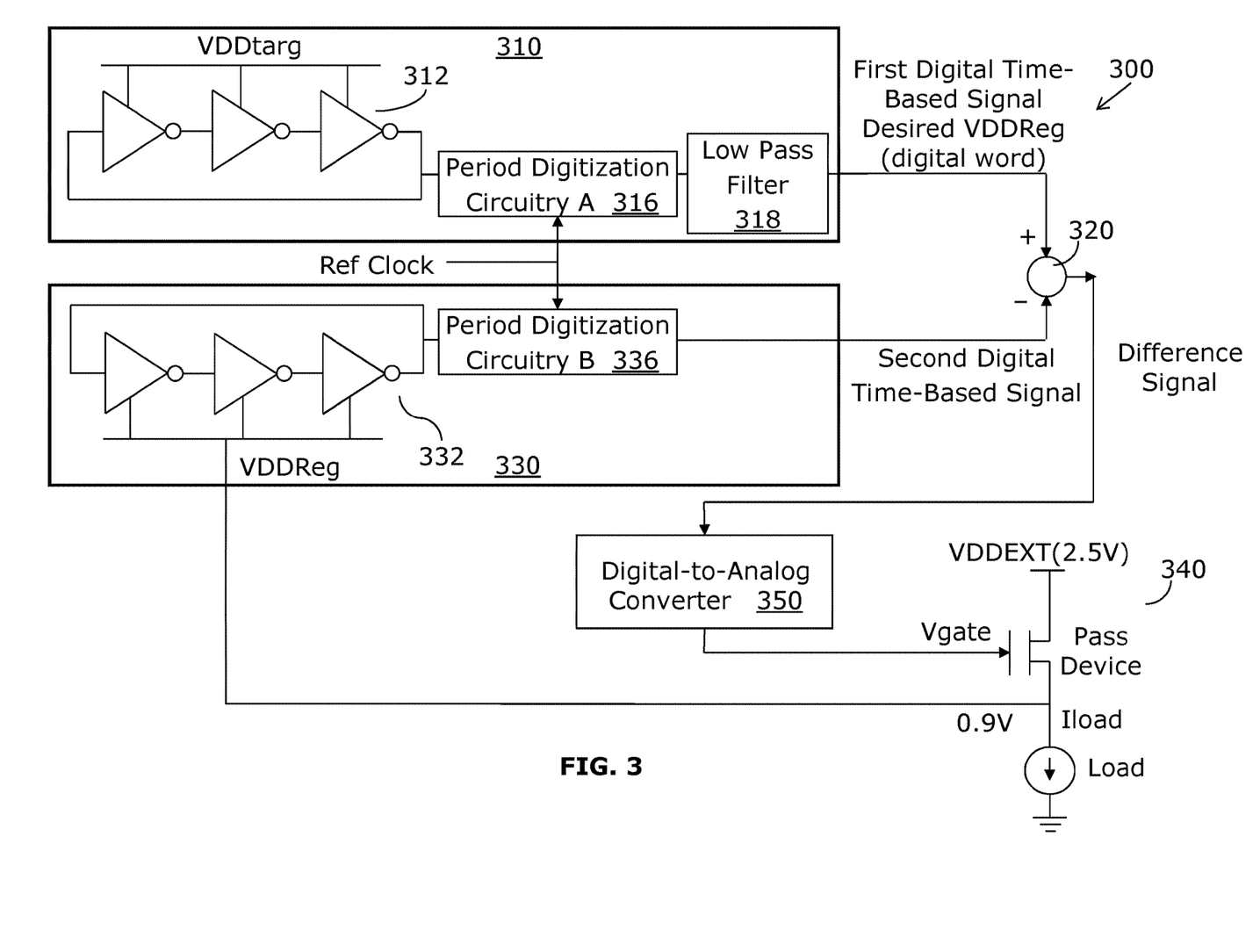
FIG. 3 illustrates one particular example of the supply voltage regulation system of FIG. 2 in accordance with various aspects described.

FIG. 3 illustrates an example voltage regulation system 300 in which oscillator A 312 and oscillator B 332 are ring oscillators. A ring oscillator includes a chain of an odd number of logical inverters (i.e., NOT gates) and the output of the chain is fed back to the input of the chain. The amount of time it takes for the inverters to switch states is directly dependent on the voltage supplied to the inverters (e.g., the target voltage for oscillator A 312 or the regulated supply voltage for oscillator B 332). Thus, the period of the signal generated by the final invertor in the ring oscillator switching states will be controlled by the voltage supplied to the oscillator. While 3 inverters are shown for each of the oscillator A 312 and oscillator B 332, any odd number of oscillators may be used. One drawback to the oscillator implementation illustrated in FIG. 3 is that a portion of the load current is consumed by the oscillator B 332. The reference clock may be a crystal based clock. Further, in some examples, a frequency divider may be used to increase the period of the reference clock to increase the number of bits present in the first digital time-based signal and the second digital time-based signal.

Period digitization circuitry A 316, period digitization circuitry B 336, low pass filter 318, and difference circuitry 320 function in response to the signals output by oscillator A 312 and oscillator B 332 in an analogous manner to that described with reference to FIG. 2. A regulator circuitry 340 includes a pass device that regulates an external supply voltage (VDDEXT of 2.5 V in one example) by selectively opening and closing to control the current flowing through the pass device so that the voltage supplied to the load approaches the target regulated supply voltage (e.g., 0.9V in one example). Thus the difference signal controls the pass device to regulate the unregulated supply voltage. In one example, the difference signal is used to incrementally adjust a gate signal currently driving the pass device.

The digital-to-analog converter (DAC) 350 converts the digital difference signal to an analog version that is provided to a gate of the pass device in the regulator circuitry 340. In one example, the DAC 350 integrates or accumulates the difference signal of FIG. 3. In fact, when the DAC 350 is an integrating DAC, the difference signal closes to zero when the system has reached the steady state. An integrating analog-to-digital converter (ADC) can be implemented with a charge-pump, for example. In general, it is desirable to have the difference signal settle at a constant, near zero value for reliability and performance reasons. However, with no accumulation or integration of the difference signal, the regulation system 300 (and also systems 100, 200, 400, 500) still functions to regulate the unregulated supply voltage.

Figure 3A:
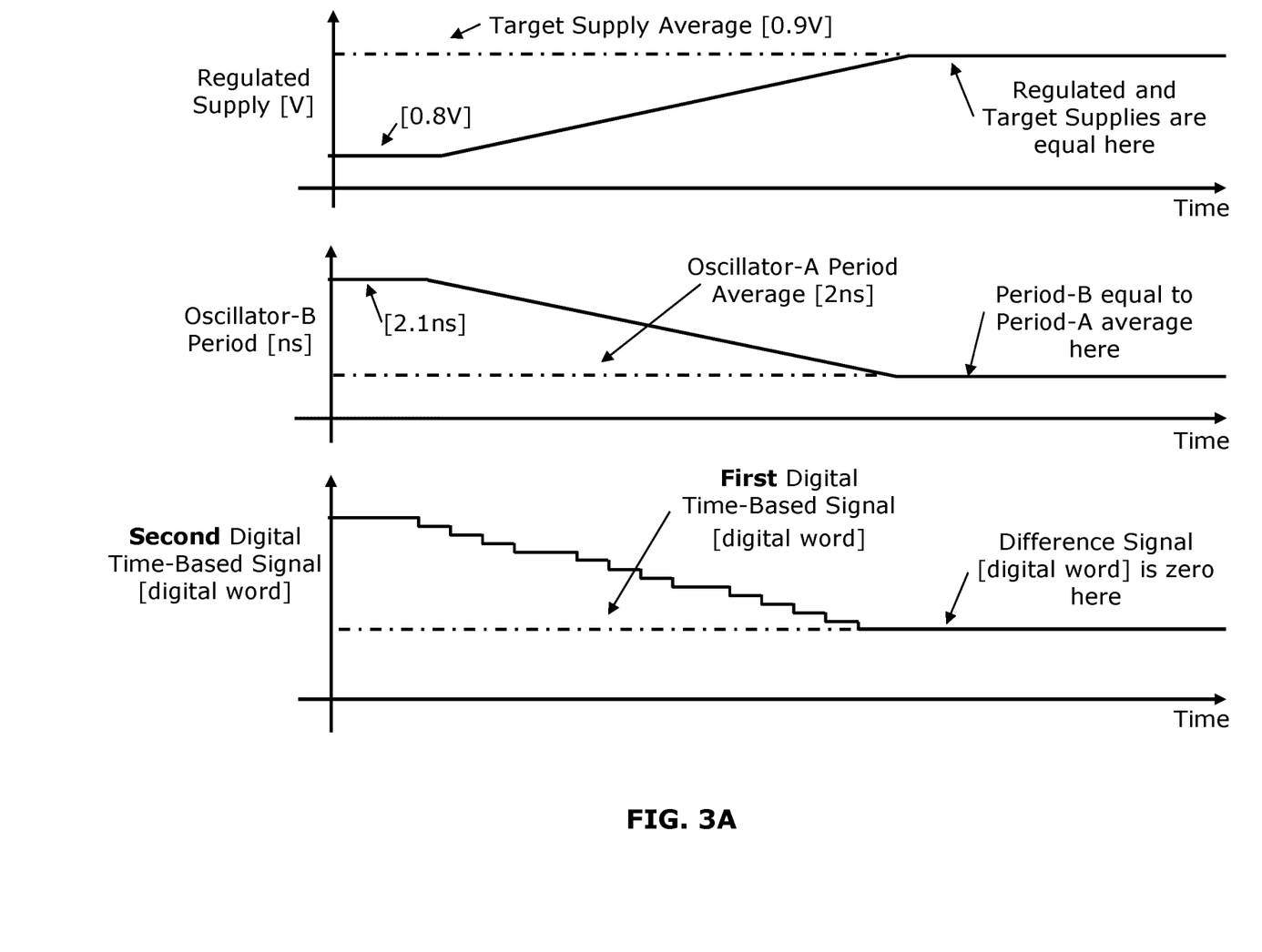
FIG. 3A illustrates an example of time-base signals that are present in the supply voltage regulation system of FIG. 3 under various operating circumstances.

FIG. 3A illustrates an example of the first and second digital time-based signals in FIG. 3 during regulation when the regulator circuitry 340 in FIG. 3 includes an integrator/accumulator. In FIG. 3A, the regulated supply voltage is assumed to be different from the target voltage, initially. When the target voltage and regulated supply voltage are not equal, the regulator loop in FIG. 3 goes through a transient response, as shown in FIG. 3A. The average value of the target voltage and the regulated supply voltage are equal at the end of the transient response, when the regulator circuitry 340 has reached a steady state. This is true when the regulator loop includes at least an integrator (in the DAC 350 for example) or an accumulator (a digital RTL-based implementation for example). When the system of FIG. 3 does not includes an integrator/accumulator the system may still operate as a regulator. In fact, the regulated supply voltage can still be regulated to the target voltage plus a constant offset voltage when there the regulator does not include an integrator/accumulator. This constant offset voltage unfortunately changes with Process-Voltage-Temperature (PVT) variations. In some cases, a constant offset voltage that changes with PVT variations can be accepted. In general, a voltage regulator with the smallest possible offset voltage is preferable. Hence, a practical implementation of the system in FIG. 3 (and also systems 100, 200, 400, 500) includes at least one "integrator/accumulator".

Figure 4:
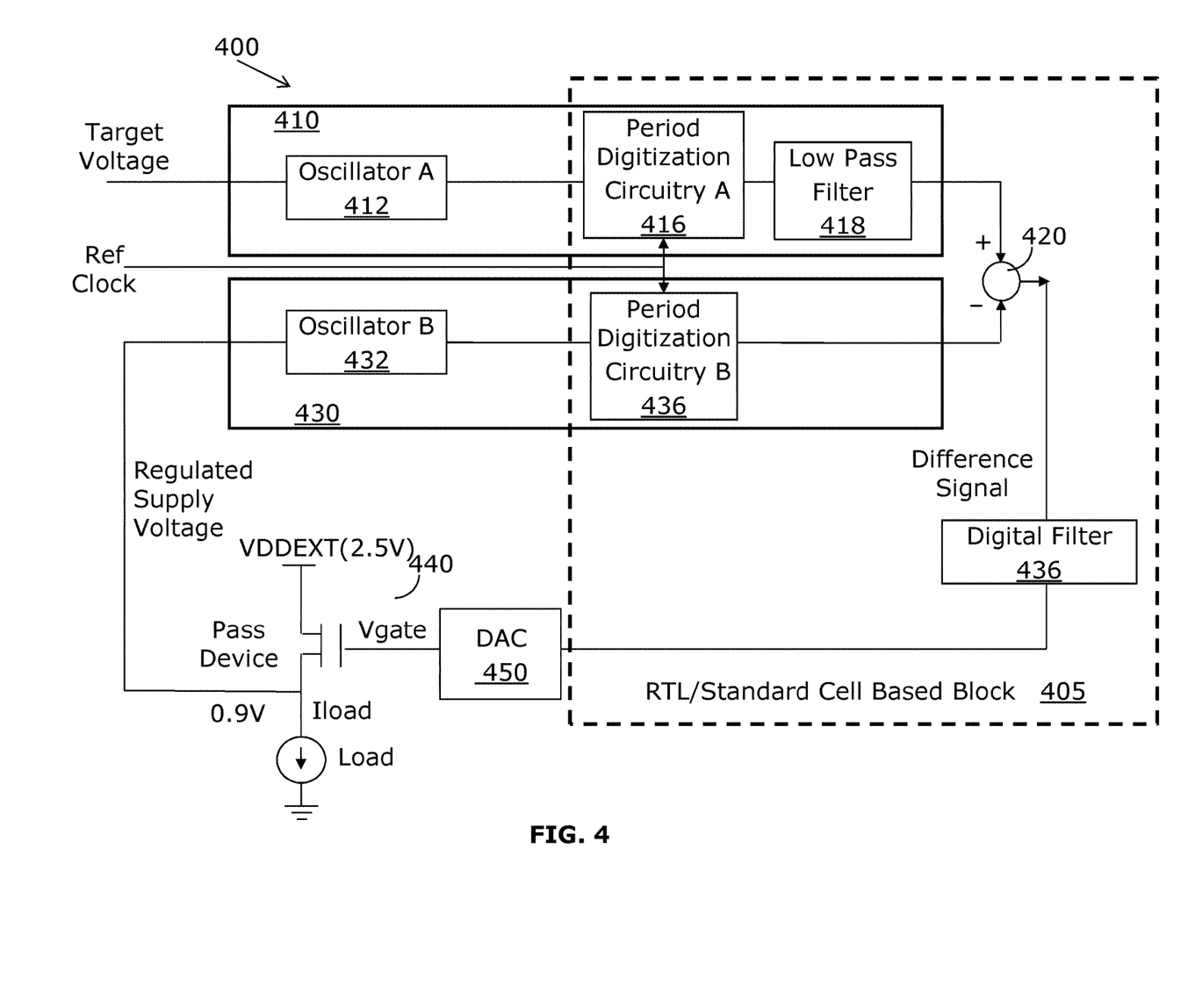
FIG. 4 illustrates one example implementation of the supply voltage regulation system of FIG. 2 in which certain components are embodied using register transfer logic (RTL) in accordance with various aspects described.

FIG. 4 illustrates one example voltage regulation system 400 in which digital components including period digitization circuitry A 416, period digitization circuitry B 436, low pass filter 418, and difference circuitry 420 are implemented in digital block that includes register transfer logic (RTL)/standard-cell based electronic/logical components. It can be seen that a significant number of components are implemented using standard digital components, which conserves space and expense associated with the analog components associated with voltage regulation systems that rely on a band-gap voltage generator and analog filters.

The digital block also includes a digital filter 436, which includes at least an accumulator when the DAC 450 is not an integrating DAC. When the DAC 450 is an integrating DAC, the digital filter 436 can be replaced with a simple digital gain for a faster regulation loop. Analog domain components, which are limited to oscillator A 412, oscillator B 432, regulator circuitry 440, and DAC 450 are arranged proximate the digital block. The configuration illustrated in FIG. 4 is well-suited for use as an embedded regulated supply voltage generator in a PLL used by a microcontroller. The "target voltage" may be a noisy supply voltage such as a core supply as long as the low pass filter 418 is able to suppress the noise in the supply voltage.

Figure 5:
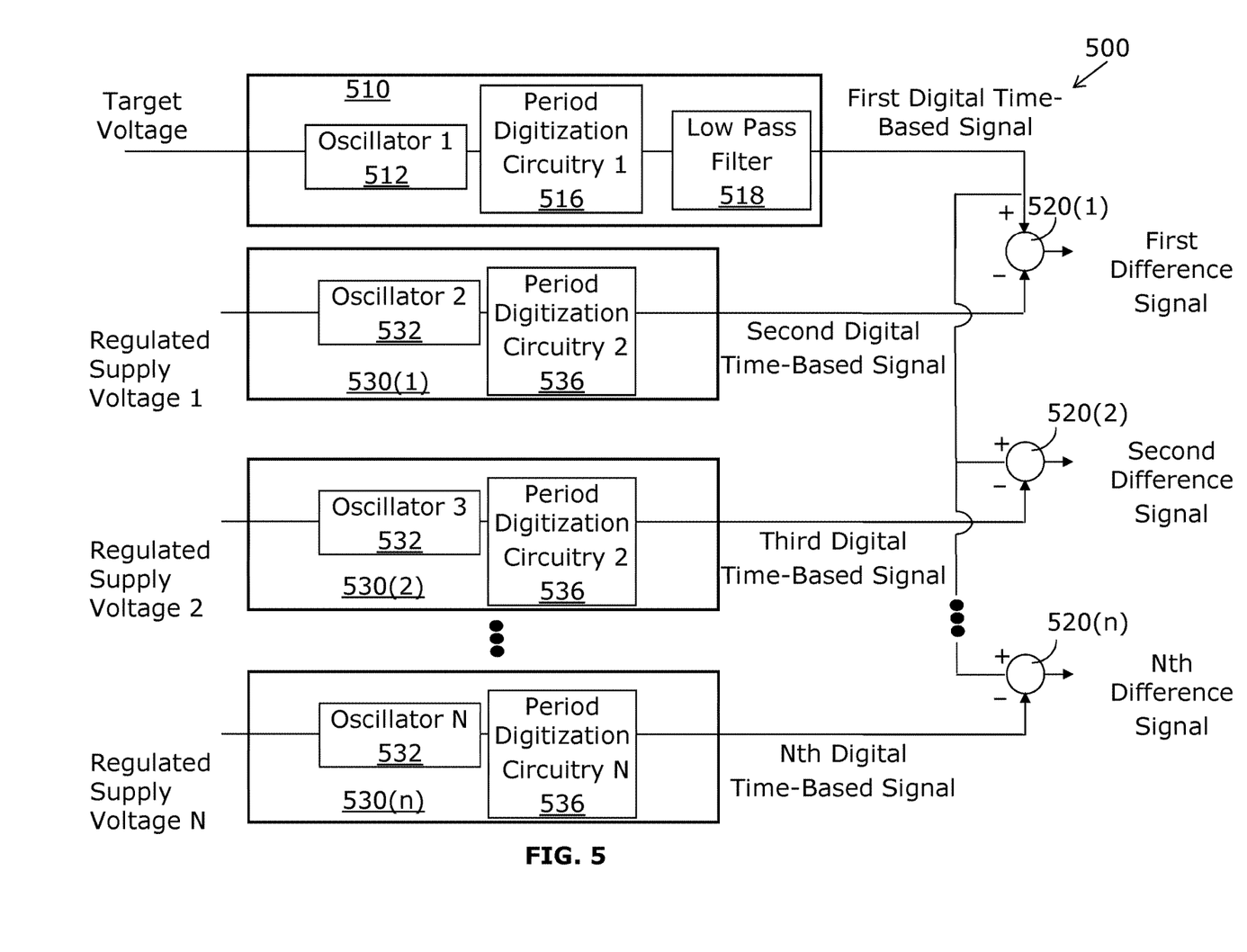
FIG. 5 illustrates one example of the supply voltage regulation system of FIG. 2 in which several regulated supply voltages are generated in accordance with various aspects described.

FIG. 5 illustrates an example voltage regulation system 500 in which multiple oscillators are used to digitize the difference between a single target voltage and N different regulated supply voltages. Voltage-to-time conversion circuitries 510 and 530(1)-530(n) function as described with reference to FIGS. 2 and 3 and an explanation will not be repeated here for the sake of brevity. The voltage-to-time conversion circuitry 510 generates a first digital time-based signal from the unregulated target voltage. The first digital time-based signal is fed to N difference circuitries 520(1)-520(n). The regulated supply voltage from each of N regulator circuitries (not shown in FIG. 5) is digitized by a respective voltage-to-time conversion circuitries 530(1)-530(n) and input to a respective difference circuitries 520(1)-520(n). The difference signal from each difference circuitry is used to control a respective regulator circuitry. In this manner, multiple regulated supply voltages can be generated with reference to the same target voltage.

Figure 6:
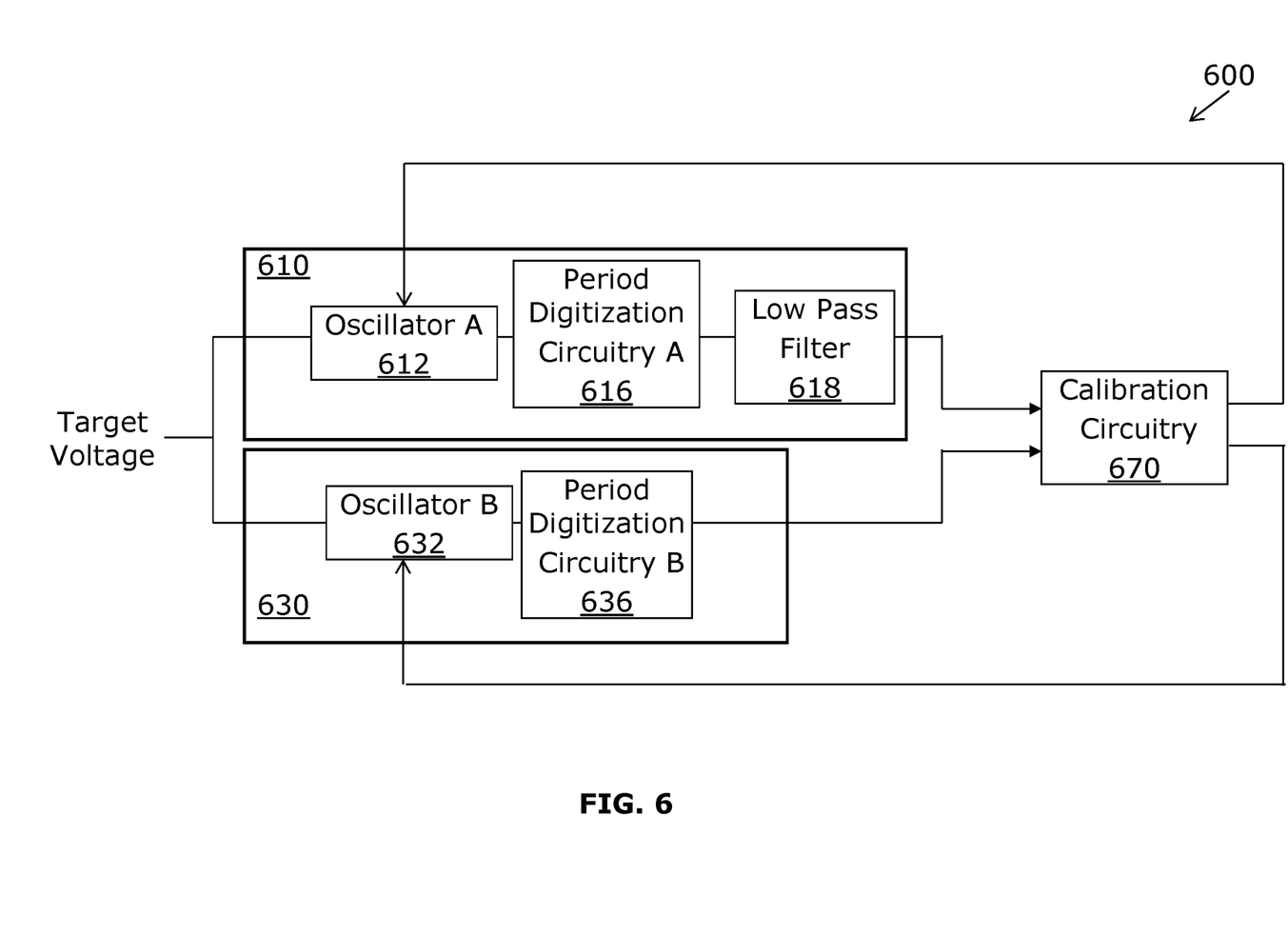
FIG. 6 illustrates one example of the supply voltage regulation system of FIG. 2 in a calibration mode in accordance with various aspects described.

FIG. 6 illustrates a voltage regulation system 600 in a calibration mode. In calibration mode, the same unregulated target voltage is fed to a first voltage-to-time conversion circuitry 610 and a second voltage-to-time conversion circuitry 630. A first digital time-based signal (e.g., encoding a duration of the period of the signal generated by oscillator A) output by the first voltage-to-time conversion circuitry 610 and a second digital time-based signal (e.g., encoding a duration of the period of the signal generated by oscillator B) output by the second voltage-to-time conversion circuitry 630 are provided to calibration circuitry 670. The calibration circuitry 670 adjusts functional parameters of the oscillator A 612 and/or the oscillator B 632 so that the difference between the first digital time-based signal and the second digital time-based signal is minimized. In this manner, the voltage-to-time conversion circuitries are self-calibrating.

Figure 7:
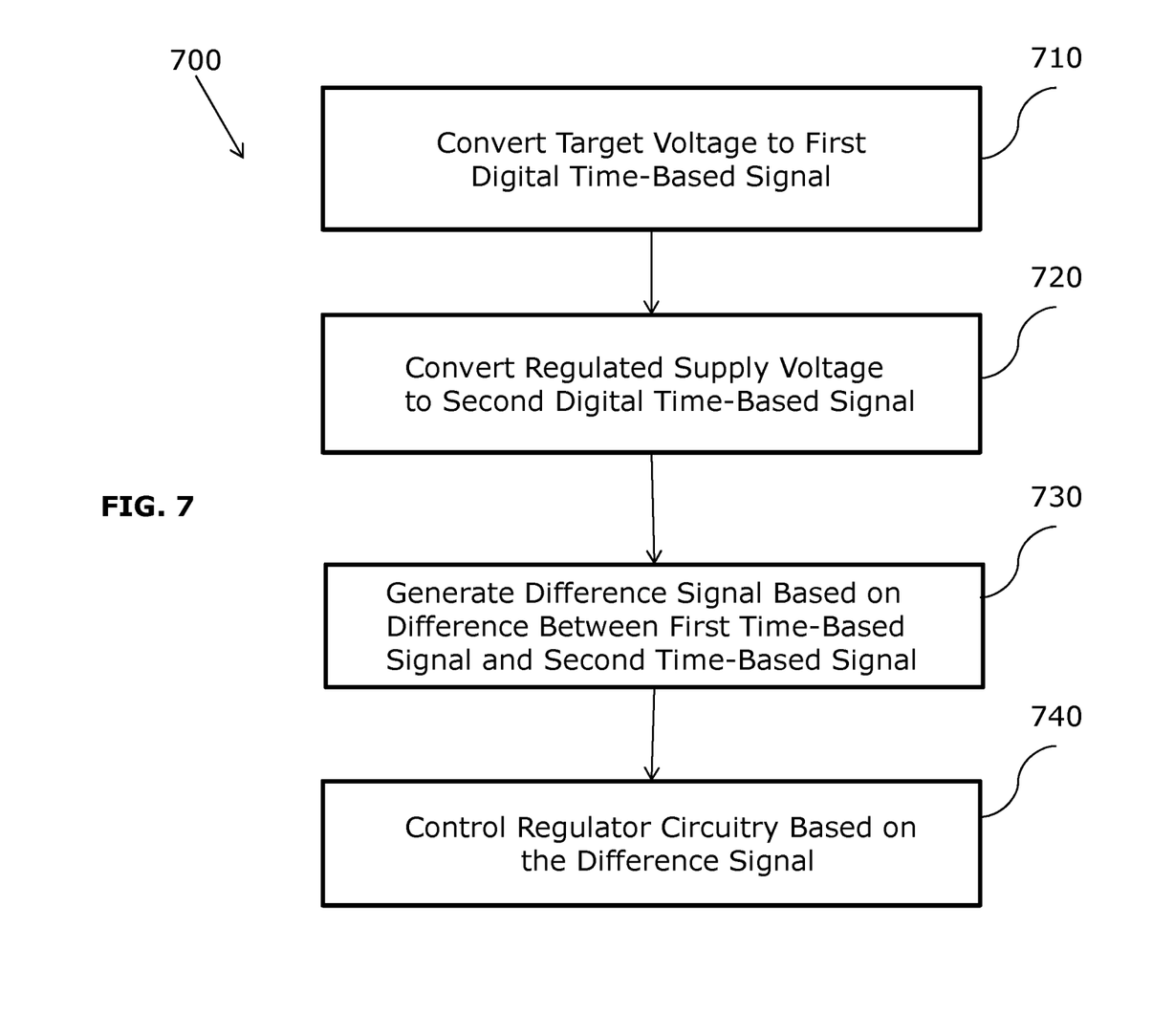
FIG. 7 illustrates an example method for generating a regulated supply voltage in accordance with various aspects described.

FIG. 7 is a flow diagram that illustrates an example method 700 for generating a regulated supply voltage for a load based on a target voltage. The method includes, at 710, converting the target voltage to a first digital time-based signal. 710 may be performed, for example by first voltage-to-time conversion circuitry 110, 210, 310, 410, 510, and/or 610 of FIGS. 1-6. The method includes, at 720, converting the regulated supply voltage to a second digital time-based signal. 720 may be performed, for example by second voltage-to-time conversion circuitry 130, 230, 330, 430, 530, and/or 630 of FIGS. 1-6. A difference signal is generated at 730 based at least on a difference between the first digital time-based signal and the second digital time-based signal. 730 may be performed, for example by difference circuitry 120, 220, 320, 420, 520, and/or 620 of FIGS. 1-6. At 740 regulator circuitry is controlled to generate the regulated supply voltage based at least on the difference signal. 740 may be performed, for example by regulator circuitries 140, 240, 340, 440, 540, and/or 640 of FIGS. 1-6.

It can be seen from the foregoing description that the described systems, circuitries, and methods regulate supply voltage without reliance on bang-gap voltage generators or analog filters. Complex functions of the voltage regulator have been pushed to the digital portion of the regulator. The architecture is fundamentally differential with the advantage that the two oscillators will respond similarly to common perturbations. Further, as shown in FIG. 6, the system can be self-calibrated.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, circuitries, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for regulating a supply voltage based on a target voltage according to embodiments and examples described herein.

Example 1 is a method for generating a regulated supply voltage for a load based on a target voltage. The method include: converting the target voltage to a first digital time-based signal; converting the regulated supply voltage to a second digital time-based signal; generating a difference signal based at least on a difference between the first digital time-based signal and the second digital time-based signal; and controlling regulator circuitry to generate the regulated supply voltage based at least on the difference signal.

Example 2 includes the subject matter of example 1, including or excluding any optional elements, further including filtering the first digital time-based signal prior to generating the difference signal.

Example 3 includes the subject matter of example 1, including or excluding any optional elements, wherein converting the target voltage to the first digital time-based signal includes: supplying a first oscillator with the target voltage to cause the first oscillator to generate a first signal having a frequency related to the target voltage; determining a first period of the first signal; and generating the first digital time-based signal based at least on the first period; and further wherein converting the regulated supply voltage to the second digital time-based signal includes: supplying a second oscillator with the regulated supply voltage to cause the second oscillator to generate a second signal having a frequency related to the regulated supply voltage; determining a second period of the second signal; and generating the second digital time-based signal based at least on the second period.

Example 4 includes the subject matter of example 3, including or excluding any optional elements, further including calibrating the first oscillator and the second oscillator by: supplying the first oscillator and the second oscillator with the target voltage; generating the difference signal; and controlling the first oscillator and the second oscillator in a manner to minimize the difference signal.

Example 5 includes the subject matter of example 1, including or excluding any optional elements, wherein the difference signal is a digital signal, and wherein the method further includes converting the difference signal to an analog difference signal and controlling the regulator circuitry with the analog difference signal.

Example 6 includes the subject matter of example 1, including or excluding any optional elements, further including filtering the difference signal and controlling the regulator circuitry with the filtered difference signal.

Example 7 includes the subject matter of example 1, including or excluding any optional elements, further including integrating the difference signal and controlling the regulator circuitry with the integrated difference signal.

Example 8 includes the subject matter of example 1, including or excluding any optional elements, wherein controlling the regulator circuitry includes providing the integrated difference signal to a pass device that selectively passes an unregulated supply voltage to the load based on the difference signal.

Example 9 includes the subject matter of example 1, including or excluding any optional elements, further including: converting a second regulated supply voltage to a third digital time-based signal; generating a digital second difference signal based at least on a second difference between the first digital time-based signal and the third digital time-based signal; and controlling regulator circuitry to generate the second regulated supply voltage based at least on the second difference signal, such that the same target voltage is used to generate both the regulated supply voltage and the second regulated supply voltage.

Example 10 is a supply voltage regulation system configured to generate a regulated supply voltage for a load based on a target voltage. The system includes: target voltage-to-time conversion circuitry configured to convert the target voltage to a first digital time-based signal; regulated supply voltage-to-time conversion circuitry configured to convert the regulated supply voltage to a second digital time-based signal; and difference circuitry configured to generate a difference signal based at least on a difference between the first digital time-based signal and the second digital time-based signal and provide the difference signal to a regulator circuitry to cause the regulator circuitry to generate the regulated supply voltage based at least on the difference signal.

Example 11 includes the subject matter of example 10, including or excluding any optional elements, wherein the target voltage-to-time conversion circuitry includes a digital filter configured to filter the first digital time-based signal.

Example 12 includes the subject matter of example 10, including or excluding any optional elements, wherein the target voltage-to-time conversion circuitry includes a first oscillator configured to input the target voltage and generate a first signal having a frequency related to the target voltage; the first period digitization circuitry is configured to determine a first period of the first signal and generate the first digital time-based signal based at least on the first period; the regulated supply voltage-to-time conversion circuitry includes a second oscillator configured to input the regulated supply voltage and generate a second signal having a frequency related to the regulated supply voltage and a period digitization circuitry configured to determine a second period of the second signal and generate the second digital time-based signal based at least on the second period.

Example 13 includes the subject matter of example 12, including or excluding any optional elements, wherein the first oscillator and the second oscillator include ring oscillators.

Example 14 includes the subject matter of example 12, including or excluding any optional elements, wherein the first period digitization circuitry and the second period digitization circuitry include counters configured to count input signal cycles that occur during the one period of a reference clock, and wherein each of the first period digitization circuitry and the second period digitization circuitry generates the first digital time-based signal and the second digital time-based signal, respectively, corresponding to a number of cycles of the first signal and the second signal in a reference clock period, respectively.

Example 15 includes the subject matter of example 10, including or excluding any optional elements, further including a digital to analog converter configured to convert the difference signal to an analog difference signal and provide the regulator circuitry with the analog difference signal.

Example 16 includes the subject matter of example 15, including or excluding any optional elements, wherein the digital to analog converter integrates the digital difference signal and converts the digital difference signal to the analog difference signal.

Example 17 includes the subject matter of example 10, including or excluding any optional elements, further including a digital filter configured to filter the difference signal and provide the regulator circuitry with the filtered difference signal.

Example 18 includes the subject matter of example 10, including or excluding any optional elements, further including second regulated supply voltage-to-time conversion circuitry configured to convert the regulated supply voltage to a third digital time-based signal and second difference circuitry configured to: determine a second difference between the first digital time-based signal and the third digital time-based signal; generate a second difference signal based at least on the second difference; and provide the second difference signal to a second regulator circuitry to cause the second regulator circuitry to generate the second regulated supply voltage based at least on the second difference signal, such that the same target voltage is used to generate both the regulated supply voltage and the second regulated supply voltage.

Example 19 is voltage-to-time conversion circuitry including an oscillator configured to input a voltage and generate an oscillator signal having a frequency related to the voltage; and period digitization circuitry configured to: determine a period of the oscillator signal; generate the digital time-based signal based at least on the period; and provide the digital time-based signal for use in controlling an electronic component based on the voltage.

Example 20 includes the subject matter of example 19, including or excluding any optional elements, wherein the oscillator includes a ring oscillator.

Example 21 includes the subject matter of example 19, including or excluding any optional elements, wherein the period digitization circuitry is configured to generate the digital time-based signal corresponding to a number of cycles of the oscillator signal occurring in a reference clock period.

Example 22 includes the subject matter of example 19, including or excluding any optional elements, further including a digital filter configured to filter the digital time-based signal.

The foregoing description of one or more implementations provides illustration and description, but is not intended to be exhaustive or to limit the scope of the example embodiments to the precise form disclosed. Modifications and variations are possible in light of the above teachings or may be acquired from practice of various implementations of the example embodiments.

Various illustrative logics, logical blocks, modules, circuitries, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In the present disclosure like reference numerals are used to refer to like elements throughout, and wherein the illustrated structures and devices are not necessarily drawn to scale. As utilized herein, terms "module", "component," "system," "circuit," "circuitry," "element," "slice," and the like are intended to refer to a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuitries can reside within a process, and circuitry can be localized on one computer and/or distributed between two or more computers. A set of elements or a set of other circuitry can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include field gates, logical components, hardware encoded logic, register transfer logic, one or more processors therein to execute software and/or firmware that confer(s), at least in part, the functionality of the electronic components.

It will be understood that when an element is referred to as being "electrically connected" or "electrically coupled" to another element, it can be physically connected or coupled to the other element such that current and/or electromagnetic radiation can flow along a conductive path formed by the elements. Intervening conductive, inductive, or capacitive elements may be present between the element and the other element when the elements are described as being electrically coupled or connected to one another. Further, when electrically coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

What is claimed is:

1. A method for generating a regulated supply voltage for a load, the method comprising:
receiving an unregulated target voltage;
converting the unregulated target voltage to an unregulated digital time-based signal;

filtering high frequency components from the unregulated digital time-based signal to generate a first digital time-based signal;
converting the regulated supply voltage to a second digital time-based signal;
generating a difference signal based at least on a difference between the first digital time-based signal and the second digital time-based signal; and
controlling regulator circuitry to generate the regulated supply voltage based at least on the difference signal.

2. The method of claim 1, wherein:
converting the unregulated target voltage to the unregulated digital time-based signal comprises:
supplying a first oscillator with the unregulated target voltage to cause the first oscillator to generate a first signal having a frequency related to the unregulated target voltage;
determining a first period of the first signal; and
generating the unregulated digital time-based signal based at least on the first period; and
converting the regulated supply voltage to the second digital time-based signal comprises:
supplying a second oscillator with the regulated supply voltage to cause the second oscillator to generate a second signal having a frequency related to the regulated supply voltage;
determining a second period of the second signal; and
generating the second digital time-based signal based at least on the second period.

3. The method of claim 2, further comprising calibrating the first oscillator and the second oscillator by:
supplying the first oscillator and the second oscillator with the unregulated target voltage;
generating the difference signal; and
controlling the first oscillator and the second oscillator in a manner to minimize the difference signal.

4. The method of claim 1, wherein the difference signal is a digital signal, and wherein the method further comprises converting the difference signal to an analog difference signal and controlling the regulator circuitry with the analog difference signal.

5. The method of claim 1, further comprising filtering the difference signal and controlling the regulator circuitry with the filtered difference signal.

6. The method of claim 1, further comprising integrating the difference signal and controlling the regulator circuitry with the integrated difference signal.

7. The method of claim 6, wherein controlling the regulator circuitry comprises providing the integrated difference signal to a pass device that selectively passes an unregulated supply voltage to the load based on the difference signal.

8. The method of claim 1, further comprising:
converting a second regulated supply voltage to a third digital time-based signal;
generating a digital second difference signal based at least on a second difference between the first digital time-based signal and the third digital time-based signal; and
controlling regulator circuitry to generate the second regulated supply voltage based at least on the second difference signal,
such that the same unregulated target voltage is used to generate both the regulated supply voltage and the second regulated supply voltage.

9. The method of claim 1, comprising receiving the unregulated supply voltage from a core power supply.

10. A supply voltage regulation system configured to generate a regulated supply voltage for a load, the system comprising:
target voltage-to-time conversion circuitry configured to:
receive an unregulated target voltage;
convert the unregulated target voltage to an unregulated digital time-based signal; and
wherein the target voltage-to-time conversion circuitry comprises a low pass filter configured to filter the unregulated digital time-based signal to generate a first digital time-based signal;
regulated supply voltage-to-time conversion circuitry configured to convert the regulated supply voltage to a second digital time-based signal; and
difference circuitry configured to:
generate a difference signal based at least on a difference between the first digital time-based signal and the second digital time-based signal; and
provide the difference signal to a regulator circuitry to cause the regulator circuitry to generate the regulated supply voltage based at least on the difference signal.

11. The supply voltage regulation system of claim 10, wherein:
the target voltage-to-time conversion circuitry comprises:
a first oscillator configured to input the unregulated target voltage and generate a first signal having a frequency related to the unregulated target voltage; and
first period digitization circuitry configured to:
determine a first period of the first signal; and
generate the first digital time-based signal based at least on the first period; and
the regulated supply voltage-to-time conversion circuitry comprises:
a second oscillator configured to input the regulated supply voltage and generate a second signal having a frequency related to the regulated supply voltage; and
second period digitization circuitry configured to:
determine a second period of the second signal; and
generate the second digital time-based signal based at least on the second period.

12. The supply voltage regulation system of claim 11, wherein the first oscillator and the second oscillator comprise ring oscillators.

13. The supply voltage regulation system of claim 11, wherein the first period digitization circuitry and the second period digitization circuitry comprise counters configured to count input signal cycles that occur during the one period of a reference clock, and wherein each of the first period digitization circuitry and the second period digitization circuitry generates the first digital time-based signal and the second digital time-based signal, respectively, corresponding to a number of cycles of the first signal and the second signal in a reference clock period, respectively.

14. The supply voltage regulation system of claim 10, further comprising a digital to analog converter configured to convert the difference signal to an analog difference signal and provide the regulator circuitry with the analog difference signal.

15. The supply voltage regulation system of claim 14, wherein the digital to analog converter integrates the digital difference signal and converts the digital difference signal to the analog difference signal.

16. The supply voltage regulation system of claim 10, further comprising a digital filter configured to filter the difference signal and provide the regulator circuitry with the filtered difference signal.

17. The supply voltage regulation system of claim 10, further comprising:
second regulated supply voltage-to-time conversion circuitry configured to convert the regulated supply voltage to a third digital time-based signal;
second difference circuitry configured to:
determine a second difference between the first digital time-based signal and the third digital time-based signal;
generate a second difference signal based at least on the second difference; and
provide the second difference signal to a second regulator circuitry to cause the second regulator circuitry to generate the second regulated supply voltage based at least on the second difference signal, such that the same unregulated target voltage is used to generate both the regulated supply voltage and the second regulated supply voltage.

18. Voltage-to-time conversion circuitry comprising:
an oscillator configured to input an unregulated voltage and generate an oscillator signal having a frequency related to the voltage;
period digitization circuitry configured to generate a digital time-based signal representative of a number of cycles of the oscillator signal occurring in a reference clock period; and
a low pass filter configured to filter the digital time-based signal and provide the digital time-based signal for use in controlling an electronic component based on the voltage.

19. The voltage-to-time conversion circuitry of claim 18, wherein the oscillator comprises a ring oscillator.

* * * * *